US010897255B2

(12) United States Patent
Akahane

(10) Patent No.: US 10,897,255 B2
(45) Date of Patent: Jan. 19, 2021

(54) DRIVE CIRCUIT

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/774,898

(22) Filed: Jan. 28, 2020

(65) Prior Publication Data

US 2020/0295759 A1 Sep. 17, 2020

(30) Foreign Application Priority Data

Mar. 11, 2019 (JP) .................................. 2019-043764

(51) Int. Cl.
*H03K 17/687* (2006.01)
*H03K 19/0175* (2006.01)

(52) U.S. Cl.
CPC ... *H03K 19/017509* (2013.01); *H03K 17/687* (2013.01); *H03K 2217/0063* (2013.01); *H03K 2217/0072* (2013.01)

(58) Field of Classification Search
CPC ... H03K 19/017509; H03K 19/018521; H03K 19/00315; H03K 19/00361; H03K 17/063; H03K 17/04123; H03K 17/04126; H03K 17/162; H03K 17/168; H03K 17/687; H03K 3/356; H03K 3/356113; H03K 2217/0036; H03K 2217/0063; H03K 2217/0072

See application file for complete search history.

(56) References Cited

U.S. PATENT DOCUMENTS

2011/0134710 A1* 6/2011 Akahane .......... H03K 19/01852
365/189.11
2017/0207785 A1* 7/2017 Akahane ............ H03K 19/0175

FOREIGN PATENT DOCUMENTS

| JP | 2011-139423 A | 7/2011 |
| JP | 2012-075267 A | 4/2012 |
| WO | 2016/009719 A1 | 1/2016 |
| WO | 2016/163142 A1 | 10/2016 |

* cited by examiner

*Primary Examiner* — Long Nguyen
(74) *Attorney, Agent, or Firm* — Rabin & Berdo, P.C.

(57) ABSTRACT

A drive circuit of a power device, including a set-side level shift circuit that receives a set signal and generates a level-shifted set signal, a reset-side level shift circuit that receives a reset signal and generates a level-shifted reset signal, a control circuit that is connected to the set-side level shift circuit and the reset-side level shift circuit, and that outputs a drive signal, a level of the drive signal changing between a first logic level for turning off the power device based on the level-shifted reset signal and a second logic level for turning on the power device based on the level-shifted set signal, and an ensuring circuit that ensures, based on the drive signal, that the control circuit controls to turn on the power device responsive to the level-shifted set signal, and to turn off the power device responsive to the level-shifted reset signal.

8 Claims, 7 Drawing Sheets

DRIVE CIRCUIT

CROSS-REFERENCE TO RELATED APPLICATIONS

The present application claims priority pursuant to 35 U.S.C. § 119 from Japanese patent application number 2019-043764, filed on Mar. 11, 2019, the entire disclosure of which is hereby incorporated by reference herein.

BACKGROUND

Technical Field

The present disclosure relates to a drive circuit that drives a power device.

Description of the Related Art

As disclosed in International Patent Application Publication Nos. WO2016/163142 and WO2016/009719, a half bridge circuit includes first and second power switching devices coupled in series between a high potential terminal and a low potential terminal of a power supply, and a node between the first power switching device and the second power switching device is coupled to a load such as a motor. The load is driven by turning on and off the first power switching device and turning on and off the second power switching device complementarily to the first power switching device. The second power switching device is turned on and off by being driven by a low-side control circuit that operates with the potential of the low potential terminal of the power supply being used as the reference potential. The first power switching device is turned on and off by being driven by a high-side control circuit that operates with the potential of the node between the first power switching device and the second power switching device being used as the reference potential.

A level shift circuit is coupled to a previous stage of the high-side control circuit and a preceding-stage circuit is coupled to a previous stage of the level shift circuit. The high-side control circuit and the level shift circuit operate at high voltage and the preceding-stage circuit operates at low voltage. The preceding-stage circuit generates a pulsed set signal and reset signal based on logic input signals from the outside, and the level shift circuit shifts the levels of the set signal and the reset signal. The high-side control circuit generates the drive signal based on the level-shifted set signal and reset signal, and turns the first power switching device on and off according to the drive signal.

When the first and second power switching devices are switched between on and off, the potential of the node between the first power switching device and the second power switching device falls below the potential of the low potential terminal of the power supply by being affected by the inductance of the load, and the voltage at the node may become negative. When such negative voltage is generated, the voltages at a set output terminal and a reset output terminal of the level shift circuit rise. Then, after such negative voltage is eliminated, the voltages at the set output terminal and the reset output terminal of the level shift circuit drop due to ringing. When the voltage at the reset output terminal exceeds a threshold voltage due to ringing while the high-side control circuit is set, the high-side control circuit is erroneously reset and an erroneous operation occurs. Meanwhile, when the voltage of the set output terminal exceeds the threshold voltage due to ringing while the high-side control circuit is reset, the high-side control circuit is erroneously set and an erroneous operation occurs.

The present disclosure has been achieved in view of the aforementioned issues, and an object thereof is to operate a control circuit that drives a power device normally even after a negative voltage is generated at a node coupled to the power device.

SUMMARY

A main aspect of the present disclosure for achieving an object described above is drive circuit comprising: a set-side level shift circuit that generates a level-shifted set signal by shifting a level of a set signal; a reset-side level shift circuit that generates a level-shifted reset signal by shifting a level of a reset signal; a control circuit that outputs a drive signal whose level changes between a first logic level for turning off a power device based on the level-shifted reset signal and a second logic level for turning on the power device based on the level-shifted set signal; and an ensuring circuit that ensures, based on the drive signal, that the control circuit turns on the power device based on the level-shifted set signal, and turns off the power device based on the level-shifted reset signal According to an aspect of the present disclosure, it is possible that a control circuit that drives a power switching device is operated normally.

BRIEF DESCRIPTION OF THE DRAWINGS

FIG. 3 is a timing chart illustrating waveforms of the voltage of a node, an input signal, an output signal, a level-shifted set signal, and a level-shifted reset signal, after a high-side power switching device is switched off from on.

DETAILED DESCRIPTION

At least the following matters are apparent from the description of the present specification and the attached drawings.

Embodiment

An embodiment of the present disclosure is described below with reference to the drawings. Note that various limitations which are technically preferable for implementing the present disclosure are added to the embodiment described below. Thus, the present disclosure is not limited to the following embodiments and illustrated examples.

1. Outline of Drive Circuit and Output Circuit

Figure 1:
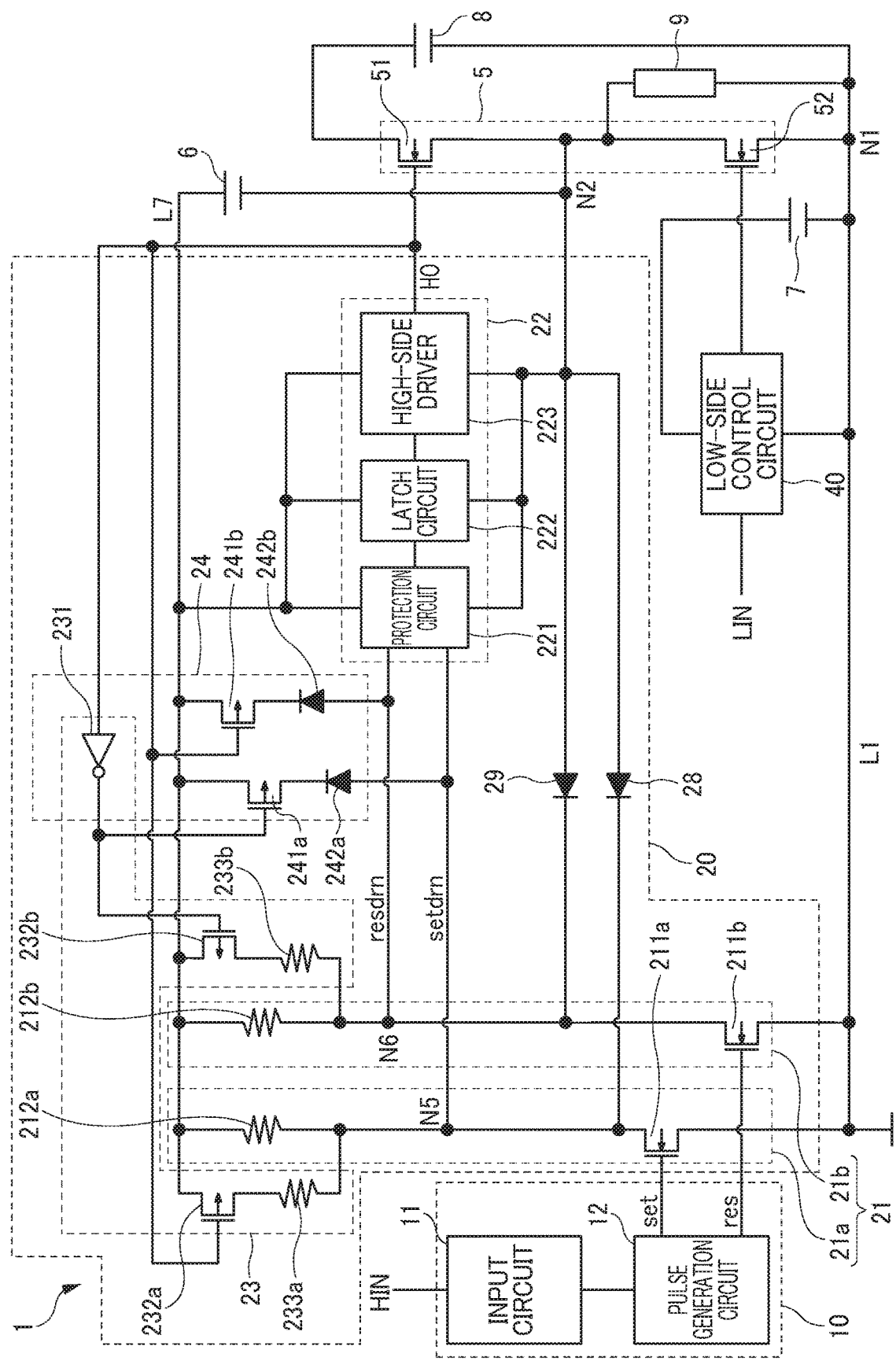
FIG. 1 is a diagram illustrating a configuration of a drive circuit together with an output circuit, a load, and power supplies.
Figure 2:
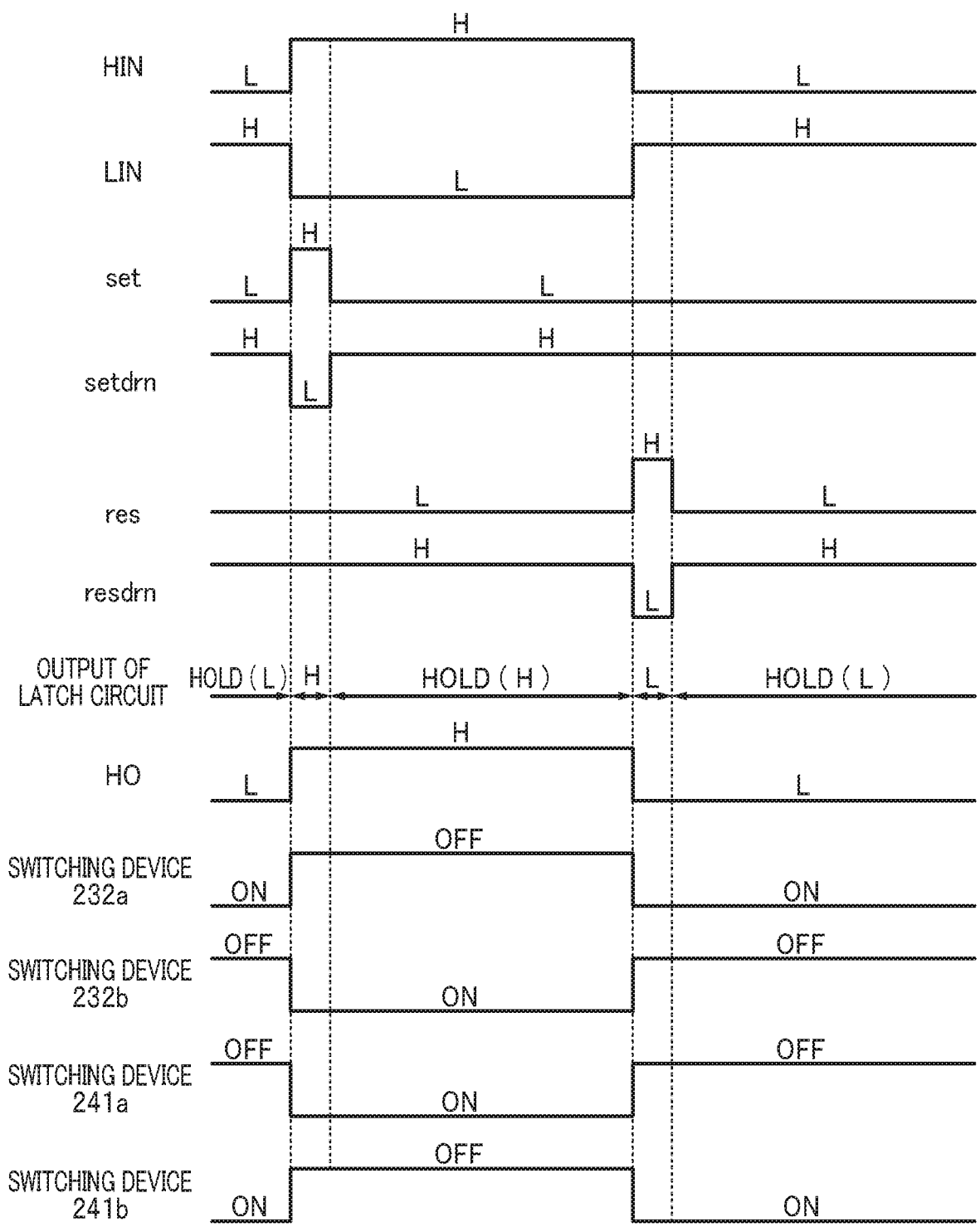
FIG. 2 is a timing chart illustrating relationships among a high-side input signal, a low-side input signal, a set signal, a level-shifted set signal, a reset signal, a level-shifted reset signal, an output of a latch circuit, an output signal, and states of switching devices.

FIG. 1 is a diagram illustrating a drive circuit 1, an output circuit 5, a load 9, and the like. FIG. 2 is a timing chart illustrating relationships among an input signal HIN, an input signal LIN, a set signal set, a level-shifted set signal setdrn, a reset signal res, a level-shifted reset signal resdrn, an output of a latch circuit 222, a drive signal HO, and states of switching devices 232a, 232b, 241a, and 241b.

The drive circuit 1 is operated by receiving the high-side input signal HIN and the low-side input signal LIN from a microcomputer. As will be described later in detail, the input signal HIN is inputted to an input circuit 11 and the input signal LIN is inputted to a low-side control circuit 40. The input signal HIN and the input signal LIN are logic input signals which repeatedly change between a first logic level and a second logic level. In this description, the first logic level refers to a low level and the second logic level refers to a high level.

The input signal HIN and the input signal LIN are in a relationship complementary to each other. Specifically, when the input signal HIN is high, the input signal LIN is low and, when the input signal HIN is low, the input signal LIN is high.

The drive circuit 1 controls the output circuit 5 based on the high-side input signal HIN and the low-side input signal LIN, and the output circuit 5 repeatedly and alternately switches the state of the load 9 between a voltage applied state in which a voltage of a high-voltage DC power supply 8 is applied to the load 9 and a ground voltage applied state in which ground voltage is applied to the load 9. The drive signal HO is a logic signal repeatedly switched between the low level (first logic level) and the high level (second logic level). Note that, if a signal delay in the drive circuit 1 is ignored, the drive signal HO for driving a high-side power device changes in synchronization with the input signal HIN.

The output circuit 5 includes power switching devices 51 and 52 forming a half bridge. The power switching devices 51 and 52 are N-channel power MOSFETs but may be power devices such as IGTBs or bipolar transistors. The power switching devices 51 and 52 are coupled in series between a high-potential output terminal and a low-potential output terminal of the high-voltage DC power supply 8. Anode N1 between the power switching device 52 and the low-potential output terminal of the high-voltage DC power supply 8 is coupled to a reference potential line L1, and the reference potential line L1 is grounded. Accordingly, the potentials of the reference potential line L1 and the node N1 result in a reference potential (ground potential) of the drive circuit 1. A node N2 between the power switching device 51 and the power switching device 52 is coupled to one end of the load 9. The other end of the load 9 is grounded by the reference potential line L1, and the potential thereof is the reference potential. The node N2 is coupled to a low-potential output terminal of a high-side DC power supply 6. A high-potential output terminal of the high-side DC power supply 6 is coupled to a high-potential line L7 and the output voltage of the high-side DC power supply 6 with respect to the potential of the node N2 is applied to the high-potential line L7.

The drive circuit 1 turns on and off the high-side power switching device 51 based on the high-side input signal HIN.

Furthermore, the drive circuit 1 turns on and off the low-side power switching device 52 complementarily to the power switching device 51 based on the low-side input signal LIN. When the power switching device 51 is on and the power switching device 52 is off, the potential of the node N2 results in the output voltage of the high-voltage DC power supply 8 and the load 9 becomes the voltage applied state. When the power switching device 51 is off and the power switching device 52 is on, the potential of the node N2 results in the reference potential and the load 9 becomes the ground voltage applied state. Accordingly, the potential of the node N2 can vary between the reference potential and the output voltage of the high-voltage DC power supply 8. Note that the load 9 changes from the voltage applied state to the ground voltage applied state after a dead time. In the dead time, both of the power switching devices 51 and 52 are turned off to prevent short circuit and through current in the high-voltage DC power supply 8. Similarly, the load 9 changes from the ground voltage applied state to the voltage applied state after a dead time.

2. Configuration of Drive Circuit

The drive circuit 1 includes a preceding-stage circuit 10, a subsequent-stage circuit 20, and the low-side control circuit 40.

The drive circuit 1 is built in a single chip. However, the drive circuit 1 may be configured such that the preceding-stage circuit 10 and the subsequent-stage circuit 20 are built in the same chip and the low-side control circuit 40 is built in another chip. Alternatively, the drive circuit 1 may be configured such that the preceding-stage circuit 10 and the low-side control circuit 40 are built in the same chip and the subsequent-stage circuit 20 is built in another chip. As another alternative, the drive circuit 1 may be configured such that the subsequent-stage circuit 20 and the low-side control circuit 40 are built in the same chip and the preceding-stage circuit 10 is built in another chip. As yet another alternative, the drive circuit 1 may be configured such that the preceding-stage circuit 10, the subsequent-stage circuit 20, and the low-side control circuit 40 are built in separate chips, respectively.

The preceding-stage circuit 10 operates at low voltage and the subsequent-stage circuit 20 operates at low voltage and high voltage.

The preceding-stage circuit 10 includes the input circuit 11 and a pulse generation circuit 12. The subsequent-stage circuit 20 includes a level shift circuit 21, a high-side control circuit 22, an adjustment circuit 23, an ensuring circuit 24, and diodes 28 and 29.

<<<2-1. Low-Side Control Circuit>>>

The low-side control circuit 40 is supplied with power from a low-side DC power supply 7 and receives the input signal LIN from the microcomputer. The low-side control circuit 40 turns on and off the power switching device 52 complementarily to the power switching device 51 based on the input signal LIN.

<<<2-2. Input Circuit>>>

The input circuit 11 includes: a comparator (not illustrated) that determines whether the input signal HIN is high or low by comparing the input signal HIN to the reference voltage; and a noise filter (not illustrated) that removes noise in the output signal of the comparator and then outputs the output signal with its noise removed. If a delay of the input circuit 11 is ignored, the output signal of the input circuit 11, that is, the output signal of the noise filter is in synchronization with the input signal HIN.

<<<2-3. Pulse Generation Circuit>>>

When the output signal of the input circuit 11 changes from low to high, the pulse generation circuit 12 generates a pulse and outputs the set signal set (see FIG. 2) whose level is high when this pulse is generated and whose level is low when this pulse disappears. Further, when the output signal of the input circuit 11 changes from high to low, the pulse generation circuit 12 generates a pulse and outputs the reset signal res (see FIG. 2) whose level is high when this pulse is generated and whose level is low when this pulse disappears. The timing in which the level of the set signal set is high is shifted in time from the timing in which the level of the reset signal res is high. The set signal set and the reset signal res are inputted to the level shift circuit 21 of the subsequent-stage circuit 20.

<<<2-4. Level Shift Circuit and Clamp Diodes>>>

As illustrated in FIG. 1, the level shift circuit 21 includes a set-side level shift circuit 21a and a reset-side level shift circuit 21b. The set-side level shift circuit 21a shifts the DC level of the set signal set outputted by the pulse generation circuit 12 while inverting the set signal set, and outputs the inverted set signal set to the high-side control circuit 22 as the level-shifted set signal setdrn (see FIG. 2). The reset-side level shift circuit 21b shifts the DC level of the reset signal res outputted by the pulse generation circuit 12 while inverting the reset signal res, and outputs the inverted reset signal res to the high-side control circuit 22 as the level-shifted reset signal resdrn (see FIG. 2).

The set-side level shift circuit 21a includes a set-side level shift switching device 211a and a set-side resistor 212a. The reset-side level shift circuit 21b includes a reset-side level shift switching device 211b and a reset-side resistor 212b.

The level shift switching devices 211a and 211b are N-channel MOSFETs having high voltage resistance, but may be IGTBs, bipolar transistors, or the like.

The set-side resistor 212a and the set-side level shift switching device 211a are coupled in series between the high-potential line L7 and the reference potential line L1. Specifically, the drain of the set-side level shift switching device 211a is coupled to the high-potential line L7 via the set-side resistor 212a, and the source of the set-side level shift switching device 211a is coupled to the reference potential line L1.

The reset-side resistor 212b and the reset-side level shift switching device 211b are coupled in series between the high-potential line L7 and the reference potential line L1. Specifically, the drain of the reset-side level shift switching device 211b is coupled to the high-potential line L7 via the reset-side resistor 212b, and the source of the reset-side level shift switching device 211b is coupled to the reference potential line L1.

An anode of the diode 28 is coupled to the node N2 and a cathode of the diode 28 is coupled to a node N5 between the set-side resistor 212a and the set-side level shift switching device 211a. Since the diode 28 clamps the potential of the node N5 to the potential of the node N2, the reference of the voltage at the node N5 is the potential of N2. Accordingly, overvoltage is prevented from being inputted to the high-side control circuit 22.

An anode of the diode 29 is coupled to the node N2 and a cathode of the diode 29 is coupled to a node N6 between the reset-side resistor 212b and the reset-side level shift switching device 211b. Since the diode 29 clamps the potential of the node N6 to the potential of the node N2, the reference of the voltage at the node N6 is the potential of the node N2. Accordingly, overvoltage is prevented from being inputted to the high-side control circuit 22.

The gate of the set-side level shift switching device 211a is coupled to a set-side output terminal of the pulse generation circuit 12 and the set signal set outputted by the pulse generation circuit 12 is inputted to the gate of the set-side level shift switching device 211a. The set-side level shift switching device 211a is turned on and off based on the set signal set. When the set-side level shift switching device 211a is turned off, the drain voltage (voltage at the node N5) is risen by the high-side DC power supply 6 to the high level. When the set-side level shift switching device 211a is turned on, the voltage at the node N5 is lowered by the ground to the low level. The voltage at the node N5 is inputted to the high-side control circuit 22 as the level-shifted set signal setdrn. Accordingly, the node N5 is an output node of the set-side level shift circuit 21a and a set-side input node of the high-side control circuit 22.

The gate of the reset-side level shift switching device 211b is coupled to a reset-side output terminal of the pulse generation circuit 12 and the reset signal res outputted by the pulse generation circuit 12 is inputted to the gate of the reset-side level shift switching device 211b. The reset-side level shift switching device 211b is turned on and off based on the reset signal res. When the reset-side level shift switching device 211b is turned off, the voltage at the node N6 is risen by the high-side DC power supply 6 to the high level. When the reset-side level shift switching device 211b is turned on, the voltage at the node N6 is lowered by the ground to the low level. The voltage at the node N6 is inputted to the high-side control circuit 22 as the level-shifted reset signal resdrn. Accordingly, the node N6 is an output node of the reset-side level shift circuit 21b and a reset-side input node of the high-side control circuit 22.

Note that the timing at which the set signal set goes high is different from the timing at which the reset signal res goes high. Accordingly, the timing in which the level-shifted set signal setdrn is low is different from the timing in which the level-shifted reset signal resdrn is low.

<<<2-4. High-Side Control Circuit>>>

The high-side control circuit 22 generates the drive signal HO based on the level-shifted set signal setdrn and the level-shifted reset signal resdrn and outputs the drive signal HO to the gate of the power switching device 51. The high-side control circuit 22 thereby turns on and off the power switching device 51. When the level-shifted set signal setdrn is low and the level-shifted reset signal resdrn is high, the high-side control circuit 22 causes the drive signal HO to be high. Meanwhile, when the level-shifted set signal setdrn is high and the level of the level-shifted reset signal resdrn is low, the high-side control circuit 22 causes the drive signal HO to be low. Note that, when both of the level-shifted set signal setdrn and the level-shifted reset signal resdrn are low or high, the high-side control circuit 22 maintains the level of the drive signal HO.

In this case, a reference voltage for the high-side control circuit 22 to detect the low level of the level-shifted set signal setdrn is referred to as set threshold voltage and a reference voltage for the high-side control circuit 22 to detect the low level of the level-shifted reset signal resdrn is referred to as reset threshold voltage.

The high-side control circuit 22 includes a protection circuit 221, the latch circuit 222, and a high-side driver 223.

The protection circuit 221 is supplied with the output voltage of the high-side DC power supply 6 with respect to the potential of the node N2. Moreover, the protection circuit 221 receives the level-shifted set signal setdrn and the level-shifted reset signal resdrn. The protection circuit 221 controls the latch circuit 222 based on the level-shifted set signal setdrn and the level-shifted reset signal resdrn. As illustrated in FIG. 2, when the level-shifted set signal setdrn is low and the level-shifted reset signal resdrn is high, the protection circuit 221 outputs a high-level signal to the latch circuit 222. When the level-shifted set signal setdrn is high and the level-shifted reset signal resdrn is low, the protection circuit 221 outputs a low-level signal to the latch circuit 222. When both of the level-shifted set signal setdrn and the level-shifted reset signal resdrn are low or high, the protection circuit 221 causes the output to be high impedance. Note that the set threshold voltage and the reset threshold voltage are determined by the configuration of the protection circuit 221.

The output voltage of the high-side DC power supply 6 with respect to the potential of the node N2 is supplied to the latch circuit 222. The latch circuit 222 is controlled according to the output of the protection circuit 221. When the output of the protection circuit 221 (input of the latch circuit 222) is high or low, the latch circuit 222 stores and outputs the value of the output. Moreover, when the output of the protection circuit 221 changes to the high impedance, the latch circuit 222 holds and outputs the value stored immediately before the change in the output of the protection circuit 221 to the high impedance.

Assume a case where the drive circuit 1 is normal. When the level-shifted set signal setdrn is low and the level-shifted reset signal resdrn is high, the output of the latch circuit 222 is high. Then, when both of the level-shifted set signal setdrn and the level-shifted reset signal resdrn are low or high, the output of the latch circuit 222 is held high. When the level-shifted set signal setdrn is high and the level-shifted reset signal resdrn is low, the output of the latch circuit 222 is low. Then, when both of the level-shifted set signal setdrn and the level-shifted reset signal resdrn are low or high, the output of the latch circuit 222 is held low.

The high-side driver 223 is supplied with the output voltage of the high-side DC power supply 6 with respect to the potential of the node N2. Moreover, the high-side driver 223 receives the output of the latch circuit 222. The high-side driver 223 generates the drive signal HO according to the output of the latch circuit 222 and outputs the drive signal HO to the gate of the power switching device 52. Specifically, the high-side driver 223 causes the drive signal HO to be low when the output of the latch circuit 222 is low, and causes the drive signal HO to be high when the output of the latch circuit 222 is high.

<<<2-5. Adjustment Circuit>>>

The adjustment circuit 23 controls the impedance between the node N5 of the set-side level shift circuit 21a and the high-potential line L7 and the impedance between the node N6 of the reset-side level shift circuit 21b and the high-potential line L7, based on the drive signal HO of the high-side control circuit 22. The adjustment circuit 23 thereby controls the magnitudes of these impedances in synchronization with the drive signal HO of the high-side control circuit 22.

Specifically, when the drive signal HO of the high-side control circuit 22 is high, the adjustment circuit 23 increases the impedance between the node N5 of the set-side level shift circuit 21a and the high-potential line L7. Further, when the drive signal HO of the high-side control circuit 22 is high, the adjustment circuit 23 reduces the impedance between the node N6 of the reset-side level shift circuit 21b and the high-potential line L7. Accordingly, when the drive signal HO of the high-side control circuit 22 is high, the impedance between the node N5 of the set-side level shift circuit 21a and the high-potential line L7 is higher than the impedance between the node N6 of the reset-side level shift circuit 21b and the high-potential line L7.

Meanwhile, when the drive signal HO of the high-side control circuit 22 is low, the adjustment circuit 23 reduces the impedance between the node N5 of the set-side level shift circuit 21a and the high-potential line L7. Further, when the drive signal HO of the high-side control circuit 22 is low, the adjustment circuit 23 increases the impedance between the node N6 of the reset-side level shift circuit 21b and the high-potential line L7. Accordingly, when the drive signal HO of the high-side control circuit 22 is low, the impedance between the node N5 of the set-side level shift circuit 21a and the high-potential line L7 is lower than the impedance between the node N6 of the reset-side level shift circuit 21b and the high-potential line L7.

The adjustment circuit 23 includes an inverter 231, a second set-side switching device 232a, a second reset-side switching device 232b, a second set-side resistor 233a, and a second reset-side resistor 233b. The switching devices 232a and 232b are P-channel MOSFETs. The second set-side switching device 232a and the second set-side resistor 233a are coupled in series between the high-potential line L7 and the node N5 of the set-side level shift circuit 21a. The second reset-side switching device 232b and the second reset-side resistor 233b are coupled in series between the high-potential line L7 and the node N6 of the reset-side level shift circuit 21b. Note that the second set-side switching device 232a and the second set-side resistor 233a may be interchanged and coupled in series between the high-potential line L7 and the node N5. The same applies to the second reset-side switching device 232b and the second reset-side resistor 233b.

The gate of the second set-side switching device 232a is coupled to an output terminal of the high-side driver 223. The gate of the second reset-side switching device 232b is coupled to an output terminal of the inverter 231 and an input terminal of the inverter 231 is coupled to the output terminal of the high-side driver 223.

The drive signal HO outputted by the high-side driver 223 is inputted to the gate of the second set-side switching device 232a. The drive signal HO is inverted by the inverter 231 and the inverted signal is inputted to the gate of the second reset-side switching device 232b. Accordingly, the second set-side switching device 232a is turned on and off based on the drive signal HO, and the second reset-side switching device 232b is turned on and off complementarily to the second set-side switching device 232a.

When the drive signal HO is high, the second reset-side switching device 232b is on and the second set-side switching device 232a is off. Accordingly, the second reset-side resistor 233b and the reset-side resistor 212b are coupled in parallel between the node N6 and the high-potential line L7, and the impedance between the node N6 and the high-potential line L7 is low. Meanwhile, since the set-side resistor 212a is coupled between the node N5 and the high-potential line L7, the impedance between the node N5 and the high-potential line L7 is high. Thus, the impedance between the node N5 and the high-potential line L7 is higher than the impedance between the node N6 and the high-potential line L7. Accordingly, when dv/dt noise is caused by parasitic capacitances of the level shift switching devices 211a and 211b or the like, the voltage at the node N5 rises more slowly than the voltage at the node N6. Thus, even when dv/dt noise is caused, the high-side control circuit 22 is surely set and thereby the drive signal HO of the high-side driver 223 remains high. This can prevent an erroneous operation of the high-side control circuit 22 caused by dv/dt noise.

When the drive signal HO is low, the second set-side switching device 232a is on and the second reset-side switching device 232b is off. Accordingly, the second set-side resistor 233a and the set-side resistor 212a are coupled in parallel between the node N5 and the high-potential line L7 and the impedance between the node N5 and the high-potential line L7 is low. Meanwhile, the reset-side resistor 212b is coupled between the node N6 and the high-potential line L7 and the impedance between the node N6 and the high-potential line L7 is high. Thus, the impedance between the node N6 and the high-potential line L7 is higher than the impedance between the node N5 and the high-potential line L7. Accordingly, when dv/dt noise is caused by parasitic capacitances of the level shift switching devices 211a and 211b or the like, the voltage at the node N6 rises more slowly than the voltage at the node N5. Thus, even when dv/dt nose is caused, the high-side control circuit 22 is surely reset and the drive signal HO of the high-side driver 223 remains low. This can prevents an erroneous operation of the high-side control circuit 22 caused by dv/dt noise.

<<<2-6. Ensuring Circuit>>>

The ensuring circuit 24 includes the inverter 231, a set-side switching device 241a, a reset-side switching device 241b, a set-side diode 242a, and a reset-side diode 242b. The inverter 231 is a component shared between the ensuring circuit 24 and the adjustment circuit 23, however the ensuring circuit 24 and the adjustment circuit 23 may include inverters, respectively.

The switching devices 241a and 241b are P-channel MOSFETs. The set-side diode 242a has an anode coupled to the node N5 and a cathode coupled to the high-potential line L7 via the set-side switching device 241a. Specifically, the set-side switching device 241a has a drain thereof coupled to the cathode of the set-side diode 242a and a source thereof coupled to the high-potential line L7.

The reset-side diode 242b has an anode coupled to the node N6 and a cathode coupled to the high-potential line L7 via the reset-side switching device 241b. Specifically, the reset-side switching device 241b has a drain thereof coupled to the cathode of the reset-side diode 242b and a source thereof coupled to the high-potential line L7.

The set-side switching device 241a has a gate thereof coupled to the output terminal of the inverter 231. The reset-side switching device 241b has a gate coupled to the output terminal of the high-side driver 223.

The drive signal HO of the high-side driver 223 is inputted to the gate of the reset-side switching device 241b. The drive signal HO of the high-side driver 223 is inverted by the inverter 231 and the inverted signal is inputted to the gate of the set-side switching device 241a. Accordingly, the reset-side switching device 241b is turned on and off based on the drive signal HO and the set-side switching device 241a is turned on and off complementarily to the reset-side switching device 241b.

The ensuring circuit 24 establishes and releases coupling of the set-side diode 242a between the node N5 and the high-potential line L7 by turning on and off the set-side switching device 241a based on the drive signal HO. Note that establishing the coupling refers to a state where the node N5 and the high-potential line L7 are coupled to each other via the set-side diode 242a, and releasing the coupling refers to a state where coupling between the node N5 and the high-potential line L7 is open. Moreover, the ensuring circuit 24 establishes and releases coupling of the reset-side diode 242b between the node N6 and the high-potential line L7 complementarily to the establishing and releasing of the coupling of the set-side diode 242a, by turning on and off the reset-side switching device 241b based on the drive signal HO. Specific operations are as follows.

When the drive signal HO of the high-side driver 223 is high, the set-side switching device 241a is on. Accordingly, the coupling between the cathode of the set-side diode 242a and the high-potential line L7 is established, and the coupling of the set-side diode 242a between the node N5 and the high-potential line L7 is established. Further, when the drive signal HO of the high-side driver 223 is high, the reset-side switching device 241b is off. Accordingly, the coupling between the cathode of the reset-side diode 242b and the high-potential line L7 is released and the coupling of the reset-side diode 242b between the node N6 and the high-potential line L7 is released (opened).

When the drive signal HO of the high-side driver 223 is low, the reset-side switching device 241b is on. Accordingly, the coupling between the cathode of the reset-side diode 242b and the high-potential line L7 is established, and the coupling of the reset-side diode 242b between the node N6 and the high-potential line L7 is established. When the drive signal HO of the high-side driver 223 is low, the set-side switching device 241a is off. Accordingly, the coupling between the cathode of the set-side diode 242a and the high-potential line L7 is released, and the coupling of the set-side diode 242a between the node N5 and the high-potential line L7 is released.

Here, in the normal state, since the potential of the node N5 is lower than the potential of the high-potential line L7, reverse bias is applied to the set-side diode 242a. Similarly, since the potential of the node N6 is lower than the potential of the high-potential line L7, reverse bias is applied to the reset-side diode 242b.

Note that the set-side switching device 241a and the set-side diode 242a may be interchanged. Specifically, the set-side switching device 241a only needs to be coupled so as to open and close an electric path extending from the high-potential line L7 to the node N5 via the set-side diode 242a. The same applies to the reset-side switching device 241b and the reset-side diode 242b.

3. Case where Negative Voltage is Generated

Figure 3:
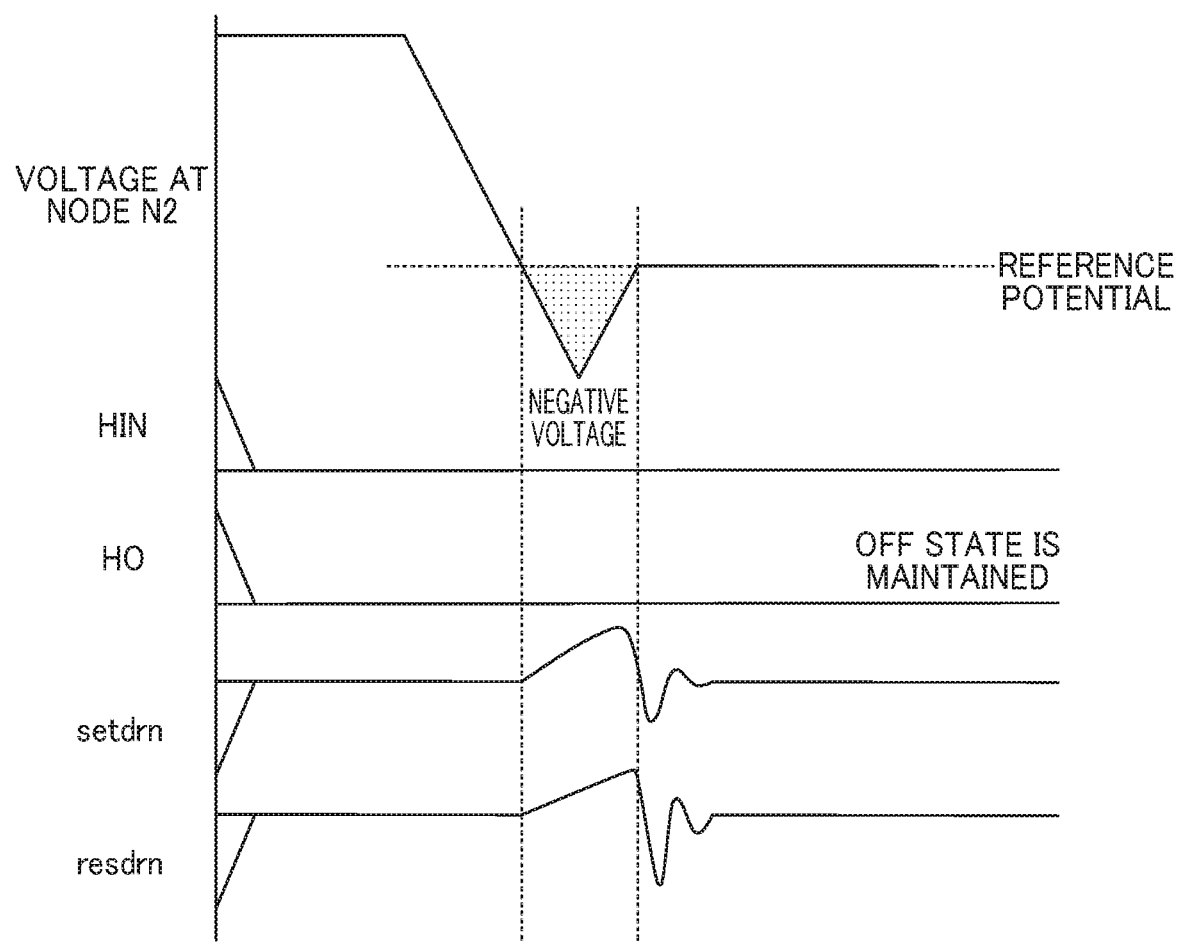
Figure 4:
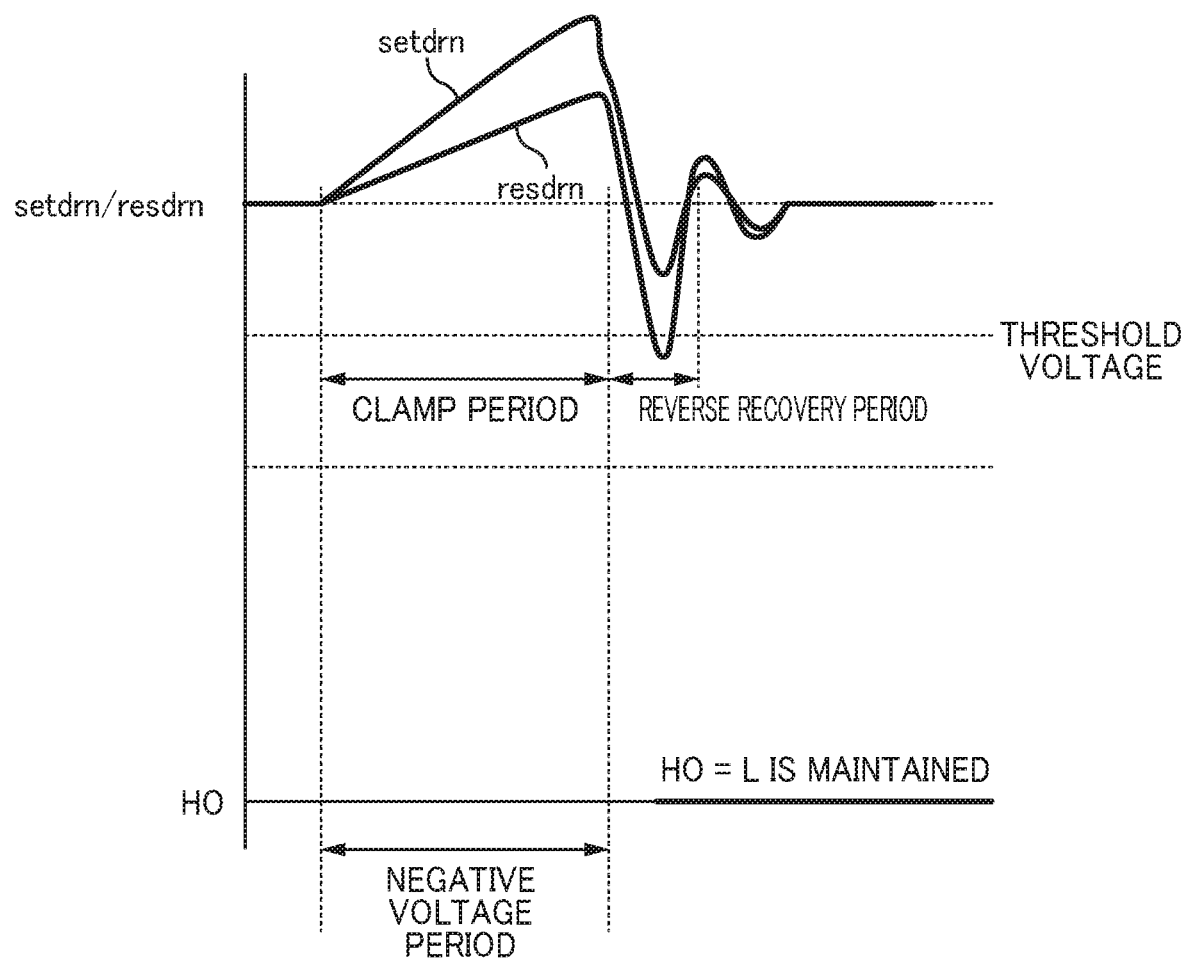
FIG. 4 is a chart in which a waveform of a level-shifted set signal and a waveform of a level-shifted reset signal illustrated in FIG. 3 are overlaid one on top of the other.
Figure 5:
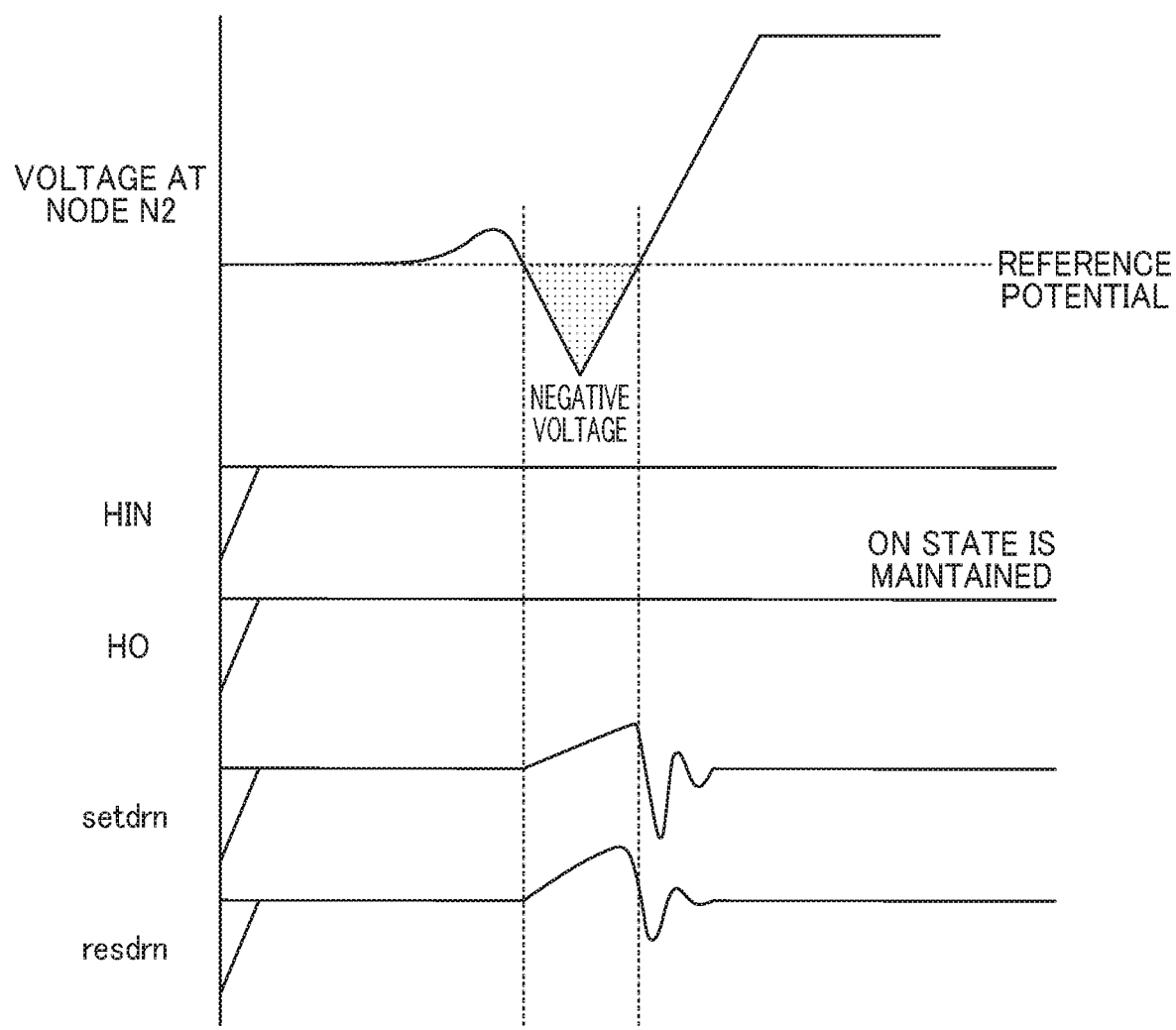
FIG. 5 is a timing chart illustrating waveforms of a voltage at a node, an input signal, an output signal, a level-shifted set signal, and a level-shifted reset signal, after a high-side power switching device is switched on from off.

As illustrated in the charts of FIGS. 3 to 5, the voltage at the node N2 may become negative by being affected by the inductance of the load 9 and dv/dt, after the power switching devices 51 and 52 are switched between on and off. When the voltage at the node N2 becomes negative, the voltages at the nodes N5 and N6 with respect to the node N2 rise. Thereafter, when the negative voltage at the node N2 is eliminated, ringing occurs in the voltages at the nodes N5 and N6 (level-shifted set signal setdrn and level-shifted reset signal resdrn). In an embodiment of the present disclosure, the ensuring circuit 24 prevents an erroneous operation of the high-side control circuit 22 caused by this ringing, and the drive signal HO of the high-side control circuit 22 remains in the state before the occurrence of the negative voltage at the node N2, even after the elimination of the negative voltage at the node N2. This will be described below more specifically.

Figure 6:
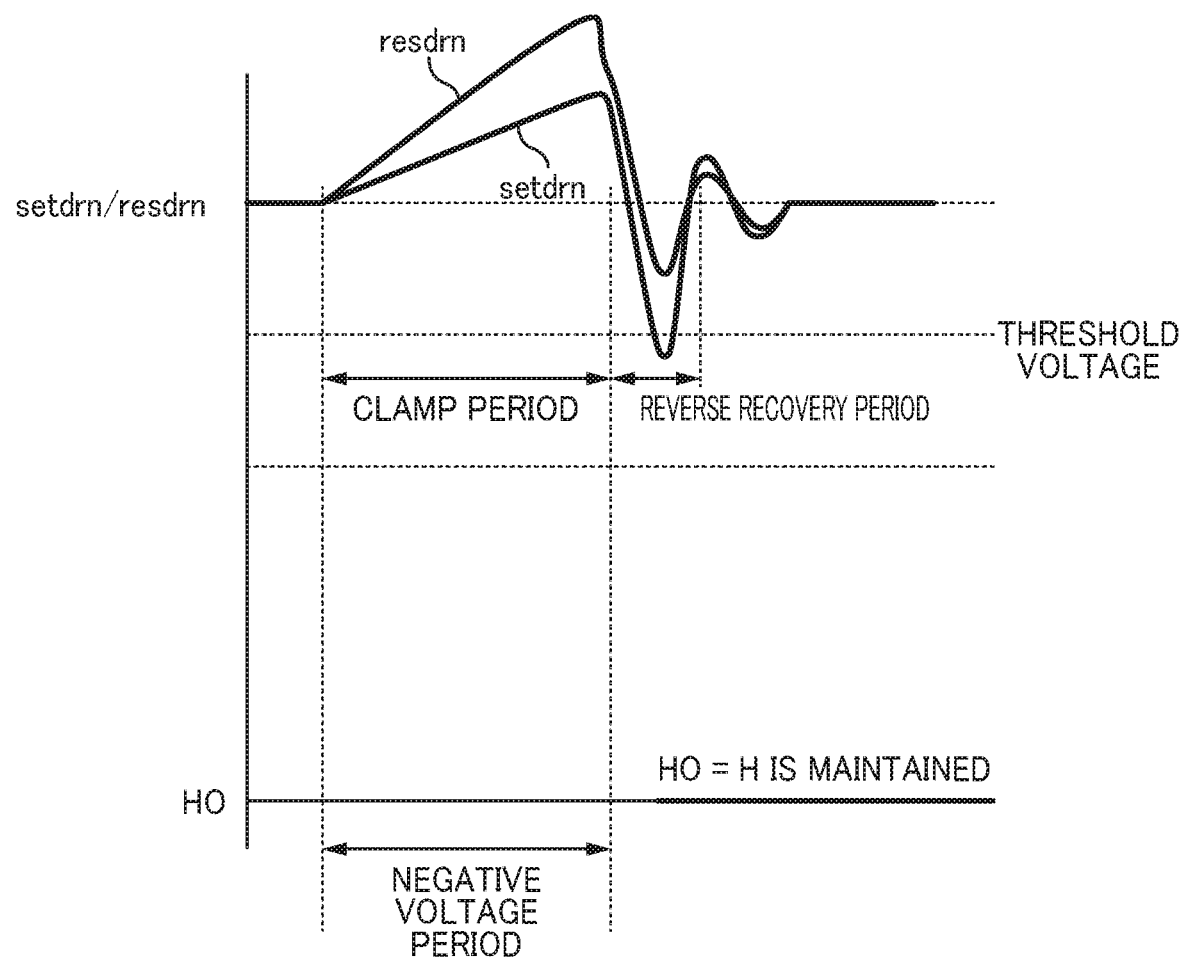
FIG. 6 is a chart in which a waveform of the level-shifted set signal and a waveform of a level-shifted reset signal illustrated in FIG. 5 are overlaid one on top of the other.

FIG. 3 is a timing chart illustrating waveforms of the voltage at the node N2, the input signal HIN, the drive signal HO, the level-shifted set signal setdrn, and the level-shifted reset signal resdrn, after the high-side power switching device 51 is switched off from on. FIG. 4 is a chart in which the waveform of the level-shifted set signal setdrn and the waveform of the level-shifted reset signal resdrn illustrated in FIG. 3 are overlaid one on top of the other. FIG. 5 is a timing chart illustrating waveforms of the voltage at the node N2, the input signal HIN, the drive signal HO, the level-shifted set signal setdrn, and the level-shifted reset signal resdrn, after the high-side power switching device is switched on from off. FIG. 6 is a chart in which the waveform of the level-shifted set signal setdrn and the waveform of the level-shifted reset signal resdrn illustrated in FIG. 5 are overlaid one on top of the other.

<<<3-1. Case Where Drive Signal HO is Low>>>

When the input signal HIN falls, the level-shifted reset signal resdrn temporarily goes low and, thereafter, both of the level-shifted reset signal resdrn and the level-shifted set signal setdrn go high (see FIG. 2). Accordingly, the drive signal HO of the high-side control circuit 22 goes low.

Then, after the power switching devices 51 and 52 are switched between on and off, as illustrated in FIGS. 3 and 4, the voltage at the node N2 becomes negative, thereby raising the voltages at the nodes N5 and N6. Specifically, since the nodes N5 and N6 are grounded (0V) via the parasitic capacitances of the set-side level shift switching device 211a and the reset-side level shift switching device 211b, the voltages at the nodes N5 and N6 become higher than the negative voltage. In this case, the coupling of the reset-side diode 242b between the node N6 and the high-potential line L7 is established. The reset-side diode 242b is thereby turned on due to a rise in the voltage at the node N6. This causes a current to flow through the reset-side diode 242b in a forward direction, and the voltage at the node N6 is clamped to the voltage of the high-potential line L7. Meanwhile, since the coupling of the set-side diode 242a between the node N5 and the high-potential line L7 is released, the voltage at the node N5 is not clamped to the voltage of the high-potential line L7. Hence, the voltage at the node N6 rises more slowly than the voltage at the node N5.

Thereafter, the voltages at the nodes N5 and N6 drop due to ringing, and the voltage at the node N6 becomes equal to or lower than the voltage of the high-potential line L7. Then, a reverse recovery phenomenon occurs in the reset-side diode 242b, where a current flows through the reset-side diode 242b in a reverse direction without the reset-side diode 242b being immediately turned off. Accordingly, the voltage at the node N6 drops more than the voltage at the node N5.

The clamping and the reverse recovery phenomenon of the reset-side diode 242b as described above contribute to making the voltage at the node N6 lower than the voltage at the node N5. Furthermore, the clamping and the reverse recovery phenomenon as described above contribute to facilitating making the voltage at the node N6 lower than the reset threshold voltage. Accordingly, the drive signal HO of the high-side control circuit 22 remains in the state before the occurrence of the negative voltage at the node N2, without the high-side control circuit 22 being set even after the elimination of the negative voltage at the node N2. In other words, the drive signal HO of the high-side control circuit 22 remains low even after the elimination of the negative voltage at the node N2.

Accordingly, the ensuring circuit 24 ensures, based on the drive signal HO, that the high-side control circuit 22 turns off the power switching device 51 based on the level-shifted reset signal resdrn. Further, in an embodiment of the present disclosure, since the impedance between the node N6 and the high-potential line L7 is higher than the impedance between the node N5 and the high-potential line L7, the voltage at the node N6 tends to rise more slowly than the voltage at the node N5. Accordingly, the adjustment circuit 23 can further maintain the state where the power switching device 51 is off.

<<<3-2. Case Where Drive Signal HO is High>>>

When both of the level-shifted reset signal resdrn and the level-shifted set signal setdrn are high after the rising of the input signal HIN, the drive signal HO is high (see FIG. 2). In this case, as illustrated in FIGS. 5 and 6, when the voltage at the node N2 becomes negative, the voltages at the nodes N5 and N6 rise. In this case, the coupling between the node N5 and the high-potential line L7 is established via the set-side diode 242a. Accordingly, with the set-side diode 242a being turning on, a current flows through the set-side diode 242a in the forward direction, and the voltage at the node N5 is clamped to the voltage of the high-potential line L7. Meanwhile, since the coupling between the node N6 and the high-potential line L7 is released with the reset-side diode 242b, the voltage at the node N6 is not clamped to the voltage of the high-potential line L7. Hence, the voltage at the node N5 rises more slowly than the voltage at the node N6.

Thereafter, the voltages at the nodes N5 and N6 drop due to ringing, and the voltage at the node N5 becomes equal to or lower than the voltage of the high-potential line L7. Then, a reverse recovery phenomenon occurs in the set-side diode 242a, where a current flows through the set-side diode 242a in a reverse direction without the set-side diode 242a being immediately turned off. Accordingly, the voltage at the node N5 drops more than the voltage at the node N6.

The clamping and the reverse recovery phenomenon of the set-side diode 242a as described above contribute to making the voltage at the node N5 lower than the voltage at the node N6. Furthermore, the clamping and the reverse recovery phenomenon as described above contribute facilitating making the voltage at the node N5 lower than the set threshold voltage. Accordingly, the drive signal HO of the high-side control circuit 22 remains in the state before the occurrence of the negative voltage at the node N2 without the high-side control circuit 22 being reset, even after the elimination of the negative voltage at the node N2. In other words, the drive signal HO of the high-side control circuit 22 remains high, even after the elimination of the negative voltage at the node N2.

Accordingly, the ensuring circuit 24 ensures, based on the drive signal HO, that the high-side control circuit 22 turns on the power switching device 51 based on the level-shifted set signal setdrn. Further, in an embodiment of the present disclosure, since the impedance between the node N5 and the high-potential line L7 is higher than the impedance between the node N6 and the high-potential line L7, the voltage at the node N5 tends to rise more slowly than the voltage at the node N6. Accordingly, the adjustment circuit 23 can further maintain the state where the power switching device 51 is on.

4. Modified Examples

Embodiments described above are presented to facilitate the understanding of the present disclosure and is not for interpreting the present disclosure in a limited manner. Moreover, the present disclosure can be modified or improved without departing from the gist of the disclosure and equivalents of the present disclosure are included in the present disclosure as a matter of course. For example, modifications as will be described in the following sections (1) and (2) can be made. The modifications of the following sections (1) and (2) can be employed in combination.

Figure 7:
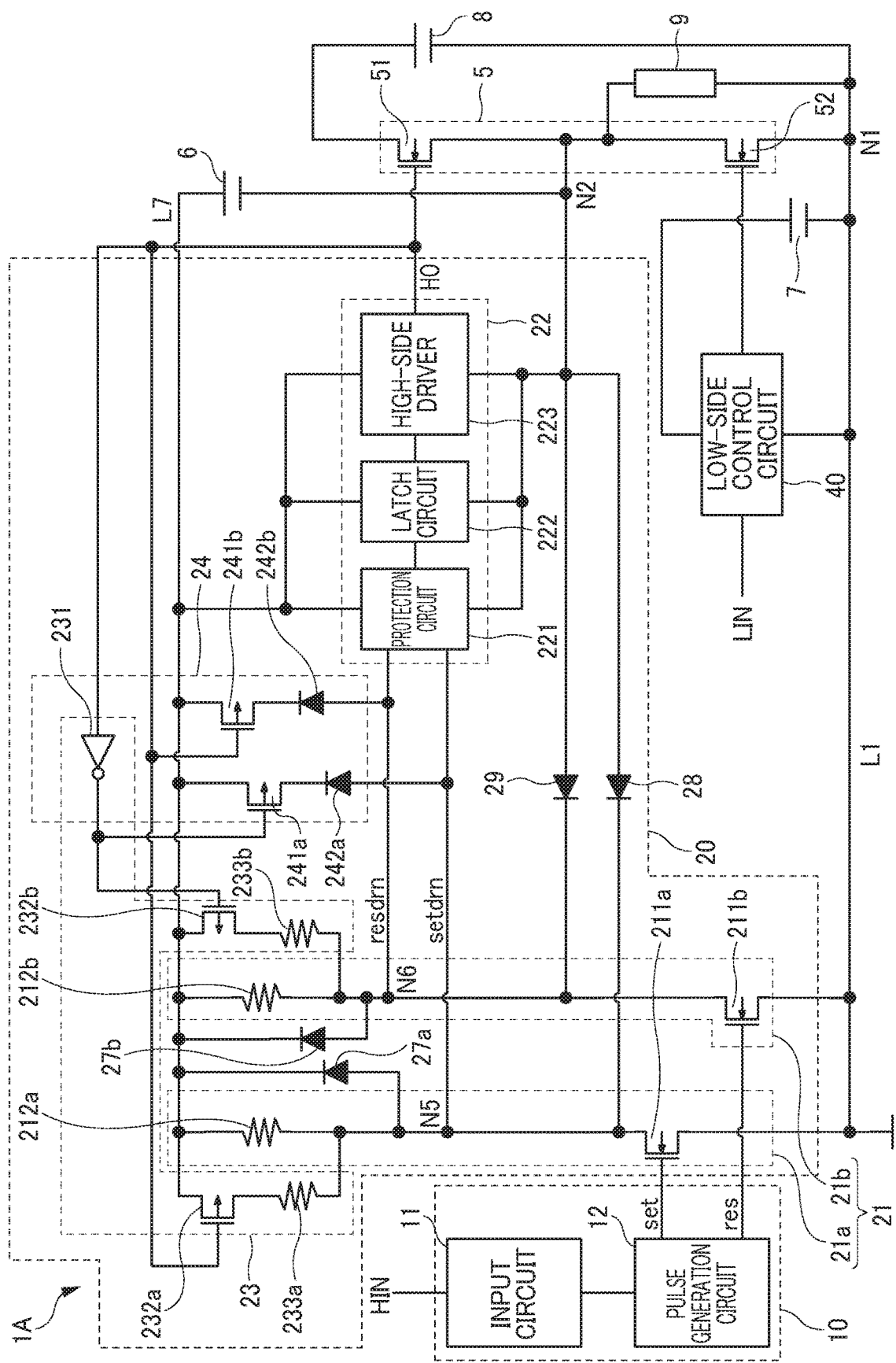
FIG. 7 is a diagram illustrating a configuration of a drive circuit in another embodiment together with an output circuit, a load, and power supplies.

(1) A drive circuit 1A illustrated in FIG. 7 includes ensuring diodes 27a and 27b in addition to the components of the drive circuit 1 illustrated in FIG. 1. The set-side ensuring diode 27a and the set-side resistor 212a are coupled in parallel between the high-potential line L7 and the node N5. The set-side ensuring diode 27a has an anode coupled to the node N5 and a cathode coupled to the high-potential line L7. The reset-side ensuring diode 27b and the reset-side resistor 212b are coupled in parallel between the high-potential line L7 and the node N6. The reset-side ensuring diode 27b has an anode coupled to the node N6 and a cathode coupled to the high-potential line L7.

When the voltage at the node N2 becomes negative while the drive signal HO of the high-side control circuit 22 is low, the voltages at the nodes N5 and N6 rise (see FIGS. 3 and 5), thereby turning on the ensuring diodes 27a and 27b. Accordingly, currents flow through the ensuring diodes 27a and 27b in a forward direction, and the nodes N5 and N6 are clamped to the high-potential line L7. In this case, the currents flowing through the ensuring diodes 27a and 27b in the forward direction are smaller than the current flowing through the reset-side diode 242b in the forward direction.

Thereafter, when the voltages at the nodes N5 and N6 drop due to ringing and becomes equal to or lower than the voltage of the high-potential line L7, a reverse recovery phenomenon occurs in the ensuring diodes 27a and 27b, where currents flow through the ensuring diodes 27a and 27b in a reverse direction without the ensuring diodes 27a and 27b being immediately turned off. The currents flowing through the ensuring diodes 27a and 27b in the reverse direction are smaller than the current flowing through the reset-side diode 242b in the reverse direction.

When the voltage at the node N2 becomes negative while the drive signal HO of the high-side control circuit 22 is high, the voltages at the nodes N5 and N6 rise (see FIGS. 3 and 5), thereby turning on the ensuring diodes 27a and 27b. Accordingly, currents flow through the ensuring diodes 27a and 27b in a forward direction, and the nodes N5, N6 are clamped to the high-potential line L7. In this case, the currents flowing through the ensuring diodes 27a and 27b in the forward direction are smaller than the current flowing through the set-side diode 242a in the forward direction.

Thereafter, when the voltages at the nodes N5 and N6 drop due to ringing and become equal to or lower than the voltage of the high-potential line L7, the reverse recovery phenomenon occurs in the ensuring diodes 27a and 27b, where currents flow through the ensuring diodes 27a and 27b in the reverse direction without the ensuring diodes 27a and 27b being immediately turned off. The currents flowing through the ensuring diodes 27a and 27b in the reverse direction are smaller than the current flowing through the set-side diode 242a in the reverse direction.

Note that the ensuring diodes 27a and 27b may be replaced with diode coupled MOSs.

(2) The diodes 242a and 242b may be replaced with diode coupled MOSs.

5. Summary (1) When the voltage at the node N2 becomes negative while the drive signal HO is low, the clamping and the reverse recovery phenomenon of the reset-side diode 242b occur, but the clamping and the reverse recovery phenomenon of the set-side diode 242a do not occur. Thus, the voltage at the node N6 is more likely to be lower than the voltage at the node N5, and the voltage at the node N6 is more likely to be lower than the reset threshold voltage. Accordingly, after the elimination of the negative voltage at the node N2, the drive signal HO of the high-side control circuit 22 remains low, without the high-side control circuit 22 being set.

(2) When the voltage at the node N2 becomes negative while the level of the drive signal HO is high, the clamping and the reverse recovery phenomenon of the set-side diode 242a occur, but the clamping and the reverse recovery phenomenon of the reset-side diode 242b do not occur. Thus, the voltage at the node N5 is more likely to be lower than the voltage at the node N6, and the voltage at the node N5 is more likely to be lower than the set threshold voltage. Accordingly, after the elimination of the negative voltage at the node N2, the drive signal HO of the high-side control circuit 22 remains high, without the high-side control circuit 22 being reset.

What is claimed is:

1. A drive circuit of a power device, comprising:
   a set-side level shift circuit that receives a set signal and generates a level-shifted set signal by shifting a level of the set signal;
   a reset-side level shift circuit that receives a reset signal and generates a level-shifted reset signal by shifting a level of the reset signal;
   a control circuit that is connected to the set-side level shift circuit and the reset-side level shift circuit, and that outputs a drive signal, a level of the drive signal changing between
      a first logic level for turning off the power device based on the level-shifted reset signal,
   and
      a second logic level for turning on the power device based on the level-shifted set signal; and
   an ensuring circuit that ensures, based on the drive signal, that the control circuit controls to turn on the power device responsive to the level-shifted set signal, and to turn off the power device responsive to the level-shifted reset signal, wherein
   each of the level-shifted set signal and the level-shifted reset signal changes between a reference potential and a high potential higher than the reference potential; and
   the ensuring circuit includes:
      a set-side diode that is so configured that a cathode thereof is coupled to a line of the high potential and an anode thereof is coupled to an output node of the set-side level shift circuit when the drive signal is at the second logic level, and
      a reset-side diode that is so configured that a cathode thereof is coupled to the line of the high potential and an anode thereof is coupled to the output node of the reset-side level shift circuit when the drive signal is at the first logic level.

2. The drive circuit according to claim 1, wherein
   when the drive signal is at the first logic level, a state of the set-side diode, in which the cathode is coupled to the line of the high potential and the anode is coupled to the output node of the set-side level shift circuit, is canceled, and
   when the drive signal is at the second logic level, a state of the reset-side diode, in which the cathode is coupled to the line of the high potential and the anode is coupled to the output node of the reset-side level shift circuit, is canceled.

3. The drive circuit according to claim 1, wherein the ensuring circuit includes:

a set-side switching device coupled in series with the set-side diode between the line of the high potential and the output node of the set-side level shift circuit, the set-side switching device being configured to be on when the drive signal is at the second logic level, and be off when the drive signal is at the first logic level, and a reset-side switching device coupled in series with the reset-side diode between the line of the high potential and the output node of the reset-side level shift circuit, the reset-side switching device being configured to be on when the drive signal is at the first logic level and be off when the drive signal is at the second logic level.

4. The drive circuit according to claim 1, further comprising:
an adjustment circuit that
reduces impedance between the line of the high potential and the output node of the set-side level shift circuit and increases impedance between the line of the high potential and the output node of the reset-side level shift circuit, when the drive signal is at the first logic level, and
increases the impedance between the line of the high potential and the output node of the set-side level shift circuit and reduces the impedance between the line of the high potential and the output node of the reset-side level shift circuit, when the drive signal is at the second logic level.

5. The drive circuit according to claim 4, wherein
the set-side level shift circuit includes:
a set-side resistor coupled to the line of the high potential, and
a set-side level shift switching device coupled in series with the set-side resistor between the line of the high potential and a line of the reference potential, the set-side level shift switching device being configured to be turned on and off based on the set signal,
a node between the set-side level shift switching device and the set-side resistor being the output node of the set-side level shift circuit;
the reset-side level shift circuit includes:
a reset-side resistor coupled to the line of the high potential, and
a reset-side level shift switching device coupled in series with the reset-side resistor between the line of the high potential and the line of the reference potential, the reset-side level shift switching device being configured to be turned on and off based on the reset signal,
a node between the reset-side level shift switching device and the reset-side resistor being the output node of the reset-side level shift circuit; and
the adjustment circuit includes:
a second set-side resistor that is so configured that one end thereof is coupled to the line of the high potential and another end thereof is coupled to the output node of the set-side level shift circuit when the drive signal is at the first logic level; and
a second reset-side resistor that is so configured that one end thereof is coupled to the line of the high potential and another end thereof is coupled to the output node of the reset-side level shift circuit when the drive signal is at the second logic level.

6. The drive circuit according to claim 5, wherein
when the drive signal is at the second logic level, a state of the second set-side resistor, in which the one end thereof is coupled to the line of the high potential and the other end thereof is coupled to the output node of the set-side level shift circuit, is canceled, and
when the drive signal is at the first logic level, a state of the second reset-side resistor, in which the one end thereof is coupled to the line of the high potential and the other end thereof is coupled to the output node of the reset-side level shift circuit, is canceled.

7. The drive circuit according to claim 5, wherein the adjustment circuit includes:
a second set-side switching device coupled in series with the second set-side resistor between the line of the high potential and the output node of the set-side level shift circuit, the second set-side switching device being configured to be off when the drive signal is at the second logic level and be on when the drive signal is at the first logic level; and
a second reset-side switching device coupled in series with the second reset-side resistor between the line of the high potential and the output node of the reset-side level shift circuit, the second reset-side switching device being configured to be on when the drive signal is at the second logic level and be off when the drive signal is at the first logic level.

8. The drive circuit according to claim 1, further comprising:
a set-side ensuring diode having an anode coupled to the output node of the set-side level shift circuit and a cathode coupled to the line of the high potential; and
a reset-side ensuring diode having an anode coupled to the output node of the reset-side level shift circuit and a cathode coupled to the line of the high potential.

* * * * *